(12) United States Patent
Garandet et al.

(10) Patent No.: US 9,938,633 B2
(45) Date of Patent: Apr. 10, 2018

(54) SYSTEM FOR MANUFACTURING A CRYSTALLINE MATERIAL BY DIRECTIONAL CRYSTALLIZATION PROVIDED WITH AN ADDITIONAL LATERAL HEAT SOURCE

(75) Inventors: Jean-Paul Garandet, Le Bourget du Lac (FR); Anis Jouini, Chambery (FR); David Pelletier, La Ravoire (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 263 days.

(21) Appl. No.: 14/240,818

(22) PCT Filed: Aug. 31, 2012

(86) PCT No.: PCT/FR2012/000346
§ 371 (c)(1),
(2), (4) Date: Feb. 25, 2014

(87) PCT Pub. No.: WO2013/030470
PCT Pub. Date: Mar. 7, 2013

(65) Prior Publication Data
US 2014/0190398 A1    Jul. 10, 2014

(30) Foreign Application Priority Data
Aug. 31, 2011 (FR) ...................... 11 02644

(51) Int. Cl.
*C30B 11/00* (2006.01)
*C30B 29/06* (2006.01)
(Continued)

(52) U.S. Cl.
CPC .......... *C30B 11/003* (2013.01); *C30B 11/007* (2013.01); *C30B 11/008* (2013.01);
(Continued)

(58) Field of Classification Search
CPC ..... C30B 29/06; C30B 11/003; C30B 11/007; C30B 35/00; Y10T 117/10
See application file for complete search history.

(56) References Cited

U.S. PATENT DOCUMENTS

2010/0148403 A1* 6/2010 Stoddard ............... C30B 11/002
  264/431
2010/0197070 A1* 8/2010 Stoddard ............... C30B 11/003
  438/68

FOREIGN PATENT DOCUMENTS

WO   WO 2009/014961 A1   1/2009

OTHER PUBLICATIONS

Oct. 24, 2012 Search Report issued in International Patent Application No. PCT/FR2012/000346 (with translation).
(Continued)

*Primary Examiner* — Matthew Song
(74) *Attorney, Agent, or Firm* — Oliff PLC

(57) ABSTRACT

The crystallization system includes a crucible provided with a bottom and with side walls designed to contain the material to be solidified and a device for creating a main thermal gradient inside the crucible in a perpendicular direction to the bottom of the crucible. An additional inductive heating device is arranged at the level of the side walls of the crucible facing the liquid material and without overlapping with the solid phase. This additional inductive heating device is configured to heat a part of the crystalline material located in the vicinity of the triple contact line between the liquid material, the solidified material and the crucible so that the interface between the liquid material and the solidified material forms a convex meniscus in the vicinity of the triple contact line.

9 Claims, 1 Drawing Sheet

(51) Int. Cl.
*C30B 28/06* (2006.01)
*C30B 33/02* (2006.01)
*C30B 35/00* (2006.01)
*H01L 31/18* (2006.01)

(52) U.S. Cl.
CPC .............. *C30B 28/06* (2013.01); *C30B 29/06* (2013.01); *C30B 33/02* (2013.01); *C30B 35/00* (2013.01); *H01L 31/182* (2013.01); *Y02E 10/546* (2013.01); *Y02P 70/521* (2015.11); *Y10T 117/1092* (2015.01)

(56) References Cited

OTHER PUBLICATIONS

Translation of Mar. 4, 2014 International Preliminary Report on Patentability issued in International Patent Application No. PCT/FR2012/000346.

* cited by examiner

SYSTEM FOR MANUFACTURING A CRYSTALLINE MATERIAL BY DIRECTIONAL CRYSTALLIZATION PROVIDED WITH AN ADDITIONAL LATERAL HEAT SOURCE

BACKGROUND OF THE INVENTION

The invention relates to a system and method for performing fabrication of a crystalline material by directional solidification. The invention applies in particular to semiconductor materials having a higher electric conductivity in liquid phase than in solid phase.

STATE OF THE ART

The silicon used in the photovoltaic industry is for the most part crystallized silicon of multicrystalline structure, i.e. with single-crystal grains without a fixed orientation with respect to one another and surrounded by grain boundaries. A sector using single-crystal silicon also exists, i.e. a single grain forms the silicon ingot. Growth of this type of material is achieved for example in a crucible in a crystallization furnace of Bridgman type or by means of the Czochralski growth technique.

A large part of the silicon used in the photovoltaic industry is produced using the Czochralski technique. However, it is important to note that the Czochralski growth technique is usually limited to formation of cylindrical ingots which is particularly problematic for use in the photovoltaic field where it is important to increase the effective surface of the photovoltaic panel.

The Bridgman technology on the other hand enables the shape of the ingot to be defined according to the shape of the crucible containing the molten material. In the Bridgman technology, the ingots are crystallized in a directional solidification furnace in which cooling of the molten material bath is controlled by a mechanical pulling device, and alternatively, in the technology called Gradient Freeze, cooling is controlled by reduction of the power delivered in the liquid phase. Displacement of the liquid/solid interface in the crucible results from modulation of the delivered heat and of the extracted heat in the different parts of the crucible.

The document WO2009/014961 describes a device for performing silicon fabrication in a crucible from a seed. In addition to primary heaters to heat the material present in the crucible, this document teaches the use of additional heaters placed around the crucible in order to modify the liquid/solid interface.

However, the use of a crucible results in an increased difficulty in control of the heat fluxes in the furnace. The side walls of the crucible increase the risks of germination of defects (spurious crystals, twin crystals) in the final ingot. The presence of crystalline defects which originate from a physico-chemical environment particular to the crucible/solid material/liquid material triple contact line is regularly observed.

The crystalline defects degrade the crystallographic quality of the materials used in photovoltaic panels which results in a decrease of the energy conversion efficiency of the final photovoltaic device.

Another technique consists in defining an air-gap between the material to be crystallized and the crucible, for example by means of an electromagnetic field originating from inductive coils. Such a teaching is presented in the document US2010/0148403.

OBJECT OF THE INVENTION

It has been observed that a requirement exists to provide ingots of crystalline material which present a smaller quantity of crystallographic defects.

This requirement tends to be satisfied by means of a system for fabrication of a crystalline material by directional solidification comprising:
  a crucible provided with a bottom and side walls designed to contain the material to be solidified,
  a device for creating a main thermal gradient in the crucible in a perpendicular direction to the bottom of the crucible,
  an additional inductive heating device arranged at the level of the side walls of the crucible and mounted mobile with respect to the crucible in a perpendicular direction to the bottom of the crucible, and configured to heat a part of the material located in the vicinity of the triple contact line between the liquid material, the solidified material and the crucible so that the interface between the liquid material and the solidified material forms a convex meniscus in the vicinity of said triple contact line.

It has also been observed that a requirement exists to provide a method that facilitates fabrication of crystal ingots with a low crystallographic defect concentration.

This requirement tends to be met by means of a fabrication method of a crystalline material by directional solidification comprising the following steps:
  providing a crucible equipped with a bottom and a side wall and at least partially filled by the crystalline material in liquid phase,
  generating a main thermal gradient in the crucible in a perpendicular direction to the bottom of the crucible so as to obtain progressive solidification of the material in the perpendicular direction starting from the bottom of the crucible,
  heating a part of the material located in the vicinity of the triple line between the liquid material, the solidified material and the crucible, by means of an additional inductive heating device arranged at the level of the side walls of the crucible and mounted mobile with respect to the crucible in said perpendicular direction, so that the interface between the liquid material and the solidified material forms a convex meniscus in the vicinity of said triple line.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
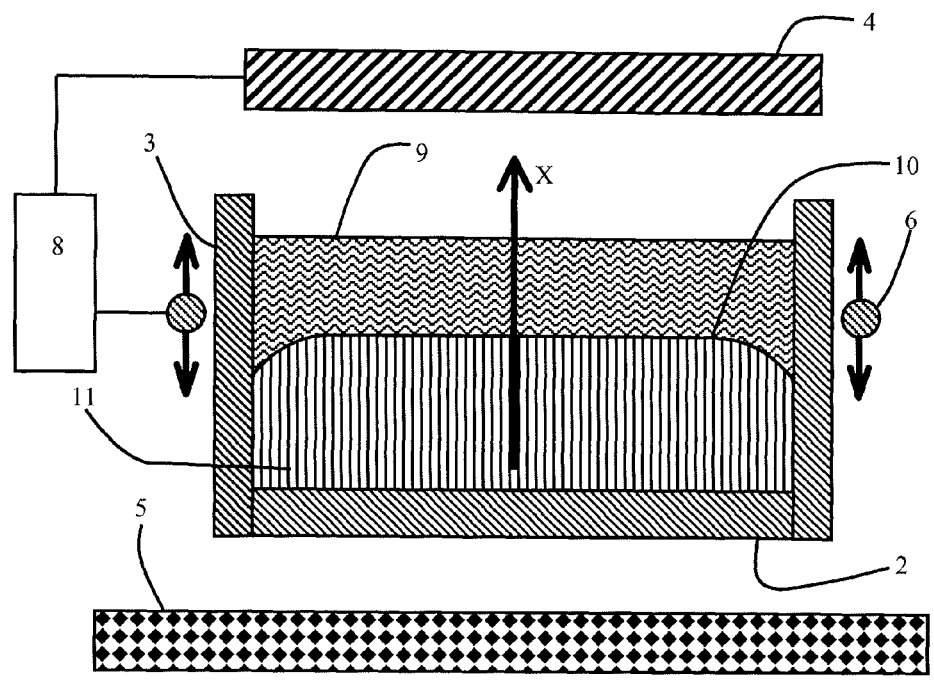
FIG. 1 schematically represents a transverse cross-section of a particular embodiment of a directional solidification system.

The directional solidification system illustrated in FIG. 1 comprises a crucible 1 provided with a bottom 2 and with side walls 3. The bottom of crucible 1 can be of any shape.

For example purposes, the cross-section (i.e. the shape formed by bottom 2 of crucible 1) can be square, rectangular or cylindrical. In preferential manner, crucible 1 presents a rectangular or square cross-section in order to facilitate production of photovoltaic panels presenting a good occupation of the available surface by the crystalline substrate.

Side walls 3 are perpendicular to bottom 2 of crucible 1 or appreciably perpendicular to bottom 2. Crucible 1 is made from a material that is resistant to the high temperatures to which it is subjected during the melting and solidification phases. In preferential manner, crucible 1 is made from silica, but it can also be made from graphite, silicon carbide or a mixture of these materials.

Crucible 1 is tightly sealed with respect to the material to be solidified, i.e. bottom 2 and side walls 3 do not enable the molten material to escape. The crucible can be monoblock, and even monolithic, i.e. made from a single material.

The directional solidification system comprises a device for generating a main thermal gradient in a perpendicular or substantially perpendicular direction to bottom 2 of crucible 1, i.e. deviating a few degrees from the perpendicular direction. The gradient is represented by an arrow X in FIG. 1. The device for generating a main thermal gradient is configured to begin solidification from bottom 2 of crucible 1. The "liquid material/solidified material" interface, i.e. the interface between the liquid phase and the solid phase of the material, moves from bottom 2 of crucible 1 towards the top of crucible 1 in the direction of arrow X.

The device for generating the thermal gradient can be formed by any suitable means, for example by a main heating device 4 placed above crucible 1 and associated with a cooling device 5 placed under bottom 2 of crucible 1. It is further possible to use a lateral heating device 4 facing side walls 3 of crucible 1. The heating devices is then able to deliver different powers according to the height in crucible 1. For example purposes, during the crystallization phase, a greater power is delivered in the top part of crucible 1 in comparison with the power delivered for bottom 2 of crucible 1. The main heating device can also be associated with a cooling device 5 arranged underneath crucible 1.

Figure 2:
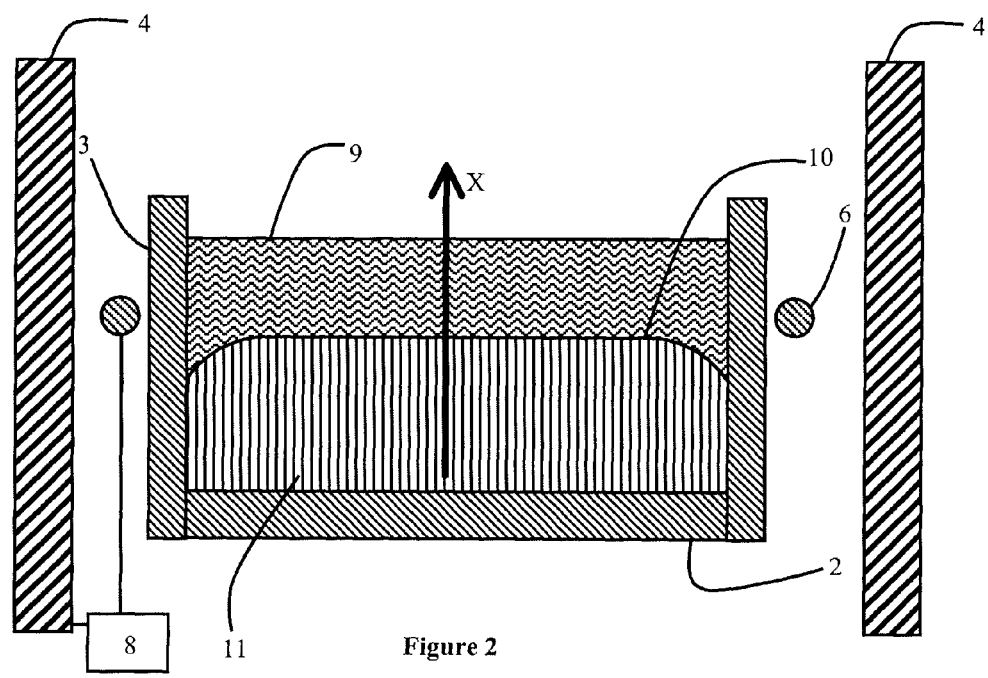
FIG. 2 schematically represents a transverse cross-section of a particular alternative embodiment of a melting/crystallization device.

In yet another embodiment, heating device 4 is fixed and vertically oriented and defines a thermal gradient depending on the height. The crucible is mounted mobile and moves in the thermal gradient imposed by the heating device. Such an embodiment is illustrated in FIG. 2.

Main heating device 4 is for example achieved using a resistive technology, a radiative technology or an inductive technology.

Crucible 1 and the device for generating the main thermal gradient in the crucible are also configured to enable displacement of the liquid/solid interface within crucible 1. Displacement of the liquid/solid interface takes place in the direction X or substantially in the direction X perpendicular to bottom 2 of crucible 1. As indicated in the foregoing, when crystallization takes place, the liquid/solid interface moves away from bottom 2 of crucible 1.

In order to reduce or even prevent germination of spurious crystals and more particularly of spurious single crystals from the side walls of the crucible, the directional solidification system comprises an additional inductive heating device 6 arranged facing at least one of side walls 3 of crucible 1 and configured to heat a part of the crystalline material located in contact with side wall 3. In other words, the directional solidification system comprises an additional inductive heating device 6 arranged at the level of side walls 3 of crucible 1 and configured to heat a part of the crystalline material located in the vicinity of the "liquid material/solidified material/crucible" triple line.

What is meant by triple line is the line formed by the intersection between the "liquid material/solidified material" interface and the crucible. The triple line is represented in the different figures by a point representative of the intersection between the crucible, the liquid phase and the solidified material. The triple line runs along the side walls of the crucible.

In order to be able to monitor the displacement of the liquid/solid interface of the material as solidification of the latter progressively takes place, the additional heating device is mounted mobile with respect to crucible 1 in a perpendicular direction to bottom 2 of crucible 1. It is advantageously mounted fixed with respect to main heating device 4.

Inductive heating device 6 is configured so that heating of the part of the material located in the vicinity of the triple line leads to formation of a convex meniscus by the liquid/solid interface, in the vicinity of the triple line. Additional device 6 thereby enables the liquid/solid interface of the material to be locally curved, towards the bottom of the crucible, at the level of the triple line.

What is meant by meniscus is a curved part of the liquid/solid interface of the material considered located in the vicinity of the triple line.

The meniscus is said to be convex when the interface presents a positive curvature, i.e. when the centre of curvature is situated in the solid phase of the material. The meniscus is then directed downwards, i.e. towards the bottom of the crucible. On the contrary, a concave meniscus is defined by a negative curvature, the centre of curvature being situated outside the solid phase of the material, in particular in the liquid phase of the latter. A concave meniscus is then directed upwards, i.e. in an opposite direction to the bottom of the crucible.

Inductive heating device 6 is configured to make the liquid/solid interface convex in the vicinity of the side wall, i.e. to have a liquid/solid interface at a greater distance from bottom 2 of crucible 1 in the centre than at the edges when bottom 2 of crucible 1 is flat. In other words, the height of the liquid/solid interface along the line X is progressively greater the larger the distance from side walls 3 in the meniscus. Inductive heating device 6 tends to progressively approach the liquid/solid interface of the bottom of the crucible as the distance from the side wall becomes smaller.

Inductive heating device 6 is formed at least by a coil, for example made from graphite or from silicon carbide. Device 6 generates an additional thermal gradient which locally modifies the main thermal gradient. This additional thermal gradient is perpendicular or substantially perpendicular to side walls 3.

Inductive heating device 6 can be arranged facing the solid phase, facing the liquid phase of the material and/or facing the liquid/solid interface of the material so as to obtain a modification of the temperature field in the crucible and to thereby obtain the required curvature of the liquid/solid interface in immediate proximity to side wall 3.

Heating device 6 is preferably facing the liquid part of the crystalline material, which enables the influence of the heat input in crucible 1 to be limited. It is particularly interesting to place the inductive coil facing the material in liquid phase as the inductive influence characterized by the thickness of electromagnetic skin is also lesser which makes it possible to improve control the thickness of the heating area and therefore the extent of the additional thermal gradient range. Positioning of the heating device facing the liquid phase takes advantage of the fact that semiconductor materials present a higher electric conductivity in liquid phase than in solid phase. In preferential manner, the solid phase is devoid of overlapping by the heating device in order to reduce the influence of this additional heating on the main thermal gradient and to therefore limit the influence of this additional gradient on formation of crystalline defects of dislocation type.

Although convection only exists in the liquid phase, the inventors observed that localized heating of the liquid phase has a lesser influence than localized heating of the solid phase. For the case of crucibles made from silica, which are electrically insulating, the temperature field in the crucible is hardly disturbed as mainly the liquid part of the material facing the coil is heated. This effect is all the more marked the closer the heating is located near the liquid/solid interface.

In order to monitor the position of the liquid/solid interface, inductive heating device 6 is associated with a displacement device of the heating device advantageously configured to place heating device 6 facing the liquid material and the solid/liquid interface throughout the crystallization phase.

The distance separating heating device 6 from the liquid/solid interface is defined such as to have an effect on the liquid and at the level of the interface in order to obtain the required curvature. The distance depends on the depth of input of the heat in the crystalline material and therefore on the supply conditions of the coil and on the electric properties of the heated material.

In a preferential embodiment that is able to be combined with the previous embodiments, the displacement device of additional heating device 6 is configured to place an inductive coil at a distance comprised between 1 and 20 mm with respect to the triple line of liquid/solid interface 10 in the perpendicular direction X to bottom 2 of crucible 1.

In an even more advantageous embodiment, the displacement device of additional heating device 6 is configured to place the inductive coil, in operation, at a distance comprised between 1 and 10 mm with respect to the triple line, to maintain the convex shape of the meniscus. The distance can be measured between the centre of the inductive coil and the triple line, for example in the perpendicular direction to the bottom of the crucible.

It is thus noteworthy that, without inductive additional heating, the liquid/solid interface of the material can, in the vicinity of the triple line, locally present the shape of a concave meniscus, i.e. directed upwards. In preferential manner, the inductive coil of additional heating device 6 is then initially positioned facing the solid phase of the material, at a distance comprised between 1 and 20 mm with respect to the triple line. The inductive coil, once activated, heats the part of the solid material that forms the concave meniscus and causes melting of the latter. The curvature of the liquid/solid interface of the material in the vicinity of the triple line is then modified and becomes positive. The position of the triple line is naturally modified and moves downwards. The interface therefore forms a convex meniscus, i.e. directed downwards. The inductive coil of additional heating device 6 is then positioned facing the liquid phase of the material. It is advantageously located at a distance comprised between 1 and 20 mm from the triple line, and preferably at a distance comprised between 1 and 10 mm from the latter in the direction X.

Inductive heating device 6 enables the material to be heated directly without previously heating crucible 1, in an electrically insulating crucible, as is the case with other heating techniques, for example resistive heating. The influence on the main thermal gradient is then reduced.

The quantity of heat input to the crystalline material and the extent of this heat input inside crucible 1 are defined by means of the current intensity delivered, the frequency and the power flowing in the coil. Localization of the heat input in the crystalline material is linked to the thickness of electromagnetic skin. The skin thickness varies according to $(\sigma \cdot f)^{-1/2}$ with $\sigma$ the electric conductivity of the material considered and f the frequency of the electromagnetic field applied by the inductive coil.

For example purposes, for liquid silicon, the skin thickness is substantially equal to 1 cm for a frequency of 1 kHz and it is about 1 mm for a frequency of 100 kHz. In this way, by modulating the frequency of the electric field flowing through the inductive coil, it is possible to adjust the spatial distribution of the heat input. Under the same conditions, the skin thickness is six times greater in solid phase which complicates the supply conditions of the inductive coil. In this case, the directional solidification system comprises a circuit for applying a current to the heating device with a frequency comprised between 1 kHz and 100 kHz when the crystalline material is silicon. However, the frequency range can be adjusted according the electric conductivity of the materials and so as to work on a heat deliverance in the crucible so that the skin thickness remains between 1 mm and 1 cm.

In particularly advantageous manner, the inductive coil or coils used are non-cooled coils. This configuration enables introduction of a cold point in the proximity of the crucible and more difficult control of a cold point in a hot area of the device to be avoided.

In a preferred embodiment, the directional solidification furnace comprises a distribution device 8 of the power delivered to additional heating device 6 with respect to the device for creating the main thermal gradient. This distribution device 8 is configured so that additional heating device 6 receives between 5% and 35% of the power delivered to the device for creating the main thermal gradient.

The ratio between the power delivered to inductive heating device 6 and the power delivered to main heating device 4 of the thermal gradient generating device is comprised between 5% and 35%. In this particular range, the effect of the additional thermal gradient is limited with respect to the main thermal gradient while at the same time being sufficiently high to considerably reduce the problems of spurious germination from the side walls. In even more preferential manner, the power delivered to inductive heating device 6 represents between 10% and 20% of the power delivered to main heating device 4 of the thermal gradient generating device in order to have an almost total reduction of the spurious germination while at the same time preserving a good control of the crystal growth according to the thermal gradient.

In a particularly preferential embodiment, the power delivered to inductive heating device 6 represents 15% of the power delivered to main heating device 4 of the thermal gradient generating device. Under these conditions, main heating device 4 is sufficiently powerful to generate a main thermal gradient able to orient the crystal growth of the molten material in the case of monocrystalline or multicrystalline growth in the whole volume of the crucible. In parallel, the additional thermal gradient is also sufficiently high to reduce generation of equiaxial crystals on the edges and even to prevent propagation of any equiaxial crystals that may have germinated on the edges of the crucible, on account of the local curvature of the interface.

In order to have displacement of mobile inductive heating 6 with the liquid/solid interface, it is possible in a first embodiment to use one or more coils which are all moved along an axis perpendicular to bottom 2 of crucible 1 according to the temperatures measured in crucible 1 and therefore according to the position of the liquid/solid interface (FIG. 1).

In an alternative embodiment, it can also be envisaged to have a set of fixed coils facing the side walls. In this case, the power supply device of the different coils is configured to supply a variable power to the different coils so as to simulate displacement of the mobile coil with the liquid/solid interface.

In a particular embodiment, additional inductive heating device 6 is mounted fixed with respect to the device for creating a main thermal gradient inside the crucible. The position of the additional heating device is fixed within the thermal gradient. The device for creating the main thermal gradient and the additional inductive heating device advantageously move in identical manner with respect to the crucible.

In another alternative embodiment, the device for generating the thermal gradient is fixed, as is inductive heating device 6. Heating device 6 is placed at a given isotherm which imposes the position of the inductive heating with respect to the liquid/solid interface. The distance is fixed between the liquid/solid interface and device 6 for a given crystalline material. In this case, it is the crucible that moves as illustrated in FIG. 2, which facilitates implementation.

The directional solidification system is particularly advantageous when crucible 1 presents an edge forming a corner between two successive side walls, for example in the case of the crucible of square or rectangular cross-section. The probability of obtaining spurious grains is reduced on the edges and especially in the corners.

For this type of architecture, it is preferable to modify the coil of device 6 in order to modulate the power delivered by the coil to crucible 1. The cross-section of the coil is reduced in the vicinity of the corners of crucible 1 in comparison with the cross-section which is facing the flat or slightly curved parts of the side walls. In this way, the current density is increased which has the effect of increasing the curvature of the liquid/solid interface in the corners of crucible 1. The spurious crystallization effects linked to the corners are reduced.

The inductive heating device introduces a lateral thermal gradient from the walls of the crucible. According to the different studies carried out in this field, the lateral thermal gradient has to generate stresses which leads to formation of crystallographic defects such as dislocations. The inventors observed that, contrary to commonly accepted ideas, the few existing defects are located at the extreme periphery of the ingot in an area that is anyway unusable as it is systematically chemically contaminated by the impurities of the crucible. Incorporation of the additional inductive heating therefore enables the general crystallographic quality of the ingot to be improved while at the same time localizing the defects on the periphery of the ingot in an unusable area.

At the outcome, the crystallographic quality of the effective ingot is enhanced.

In a particular embodiment, the directional solidification system comprises a vertical furnace illustrated in FIG. 2. The furnace comprises three areas, a hot area at 1480° C., a cold area at 1300° C. and the intermediate area defining the thermal gradient.

The main heating is obtained by means of a resistive device. The power necessary for obtaining the thermal gradient between the hot and cold areas is equal to 10 kW. Temperature control is performed by means of thermocouples of C type. The distance separating the hot area from the cold area is equal to 10 cm.

The crucible is of the type having a square cross-section of 35*35 cm². The height of the side walls is equal to 80 cm. The ingot pull rate is equal to 25 mm/h.

Inductive heating device 6 is formed by a graphite coil with a diameter equal to 1 cm. The coil has a circular cross-section. The centre of the disk is located 5 mm above the liquid/solid interface. The coil is connected to a current generator which delivers a power equal to 1.5 kW. The current frequency is equal to 10 kHz.

In an alternative embodiment, the diameter of the coil is reduced to 8 mm facing the four corners of the crucible over a distance of 1 cm.

Thus, by means of this type of crucible, it is possible to perform crystallization of a molten material bath reducing the quantity of crystalline defects.

The crucible provided with a bottom and side walls is at least partially filled by a material in liquid phase 9. The material can be melted in the device or in another device and then decanted.

A main thermal gradient is generated in the crucible in the direction X perpendicular to bottom 2 of crucible 1 so as to have a displacement of liquid/solid interface 10 away from bottom 2 of crucible 1.

A lateral additional thermal gradient is generated in the crucible in a parallel direction to bottom 2 of crucible 1. The additional thermal gradient originates from at least one coil of heating device 6. The coil is facing the liquid/solid interface and the liquid phase to effectively curve interface 10 limiting the modifications of the main thermal gradient in the rest of the material. The lateral thermal gradient is located immediately after the side walls and moves with liquid/solid interface 10 so as to be arranged at the liquid/solid interface and in liquid phase 9.

As crystallization progressively takes place, the quantity of solid phase 11 increases in crucible 1.

This type of method is compatible for producing monocrystalline or polycrystalline ingots. It can be used to form ingots made from silicon or other semiconductor materials. Reduction of the crystallographic defects is obtained by means of additional inductive heating 6 which can be placed on an edge of the crucible, on several edges of the crucible or on all the edges of the crucible depending on the user's requirements. It is also very simple to change the shape of the ingot between two crystallization steps, the crucible and if necessary the shape of inductive heating coil 6 simply having to be changed.

The fabrication method is particularly suitable for semiconductor materials that present a higher electric conductivity in liquid phase than in solid phase which limits the effect of the inductive heating on the solidified material.

In a particular embodiment, during the solidification process, the solid/liquid interface is observed in order to determine its shape. If the latter is concave, the coil approaches the liquid/solid interface or is even located at the level of the triple line so that as soon as the additional heating device is powered on, the solid/liquid interface becomes convex and the inductive coil is facing the liquid material without overlapping with the solid phase.

The invention claimed is:

1. A method for performing fabrication of a crystalline material by directional solidification comprising the following steps:
    providing a crucible equipped with a bottom and a side wall and at least partially filled by the crystalline material in liquid phase,
    generating a main thermal gradient inside the crucible in a first direction substantially perpendicular to the bottom of the crucible so as to obtain progressive solidification of the crystalline material in the first direction and starting from the bottom of the crucible, and
    heating a part of the crystalline material located in the vicinity of the triple contact line formed at an intersection between the liquid crystalline material, the solidified crystalline material, and the side walls of the crucible, by means of an additional inductive heating device arranged at the level of the side walls of the crucible and mounted mobile with respect to the crucible in said first direction, so that the interface between the liquid crystalline material and the solidified crystalline material forms a convex meniscus in the vicinity of said triple contact line, the additional inductive heating device being arranged facing the liquid crystalline material and without overlapping with the solid crystalline phase.

2. The method according to claim 1, wherein the ratio between the power delivered to the additional inductive heating device and the power delivered to a heating device configured for generating the main thermal gradient is comprised between 5% and 35%.

3. The method according to claim 1, wherein the additional inductive heating device is formed by an inductive coil positioned at the level of the liquid/solid interface and facing the liquid crystalline material when the interface between the liquid crystalline material and the solidified crystalline material forms a convex meniscus in the vicinity of said triple contact line.

4. The method according to claim 3, wherein the inductive coil is positioned at a distance comprised between 1 and 20 mm with respect to said triple contact line in the first direction.

5. The method according to claim 3, wherein said crystalline material is a semiconductor material that presents a higher electric conductivity in liquid phase than in solid phase.

6. The method according to claim 1, wherein the additional inductive heating device moves with respect to the bottom and to the side wall during solidification of the crystalline material.

7. The method according to claim 1, wherein the liquid material is heated so as to form a liquid/solid interface coming in contact with the sidewalls of the crucible.

8. The method according to claim 1, wherein a liquid/solid interface is formed having a first curvature in a central part of the crucible and a second curvature in the vicinity of the triple contact line, the first curvature being lower than the second curvature.

9. The method according to claim 8, wherein the liquid/solid interface is substantially flat in the central part of the crucible.

* * * * *